United States Patent [19]

Huellwegen

[11] 3,958,082

[45] May 18, 1976

[54] CIRCUIT ARRANGEMENT FOR CONTROLLING OF AMPLIFICATION DEVICES IN A SEMI-DUPLEX DATA SIGNAL TRANSMISSION SYSTEM

[75] Inventor: Josef Huellwegen, Altenbeken, Germany

[73] Assignee: Nixdorf Computer AG, Paderborn, Germany

[22] Filed: Jan. 13, 1975

[21] Appl. No.: 540,446

[30] Foreign Application Priority Data

Mar. 13, 1974 Germany.............................. 2412127
Oct. 24, 1974 Germany............................ 2450633

[52] U.S. Cl................................................ 178/58 A
[51] Int. Cl.²........................................... H04L 5/16
[58] Field of Search..................... 178/58 R, 58 A; 325/400, 326; 179/1 F; 343/178, 175

[56] References Cited
UNITED STATES PATENTS

| | | | |
|---|---|---|---|
| 2,206,146 | 7/1940 | Wright................................... | 178/58 |
| 3,571,512 | 3/1971 | Quiros.................................... | 178/58 |

Primary Examiner—Douglas W. Olms
Attorney, Agent, or Firm—Woodhams, Blanchard and Flynn

[57] ABSTRACT

An improvement in a circuit arrangement for controlling of amplification devices in a semi-duplex data signal transmission system. The circuit arrangement is comprised of an integral control which is controlled by a normal magnitude signal derived from the output of a respective amplification device in the data signal transmitting path. The integral control delivers a control signal for adjusting a correcting element and an amplification factor within the circuit arrangement. The specific improvement is the provision of a controllable switch which is controllable based upon the magnitude of the arriving data signals. The switch is connected in a loop located between the output terminal and the input to the correcting element. The control loop controls the signal level of signals being transmitted along the data signal transmitting path so that signal transmission can occur immediately following the receipt of data and immediately upon a change of the data signal transmission system from a transmitting condition to a receiving condition.

13 Claims, 4 Drawing Figures

CIRCUIT ARRANGEMENT FOR CONTROLLING OF AMPLIFICATION DEVICES IN A SEMI-DUPLEX DATA SIGNAL TRANSMISSION SYSTEM

FIELD OF THE INVENTION

The invention relates to a circuit arrangement for controlling of amplification devices in a semi-duplex data signal transmission system having an integral control which is controlled by a normal magnitude signal derived from the output of the respective amplification device in the data signal transmitting path, which integral control delivers a control signal for adjusting a correcting element adjusting the amplification.

BACKGROUND OF THE INVENTION

In the data signal transmission through telephone channels and in particular for two-wire lines, the so-called semi-duplex operation is carried out, in which between two subscriber points alternately data signal blocks and acknowledgement signals are transmitted, in order to keep as low as possible, for example, the load of the transmitting devices and also the lines. A grounded data signal block contains for example 100 signals within an entire duration of, for example, 120 msec. at a transmission speed of 4800 Bd. In carrying out the semi-duplex operation, however, a time is required for the alternate switching of the data signal blocks and the acknowledgement signals, which many times exceeds the time which is required for transmitting such a data signal block.

In view of these conditions, it is required, in the semi-duplex operation, that the switching over between transmitting and receiving functions of the transmitting devices be as short as possible, in order to have available an optimum amount of time for the actual data transmission.

Data signal and receiving apparatus connected to transmitting lines contain a variable-gain amplifier, which amplifies arriving data signals within a specified level zone always to such a level and balances out level variations, that they can be evaluated perfectly. However, each variable-gain amplifier has a control time constant, which stands against the above-illustrated requirement of switching-over times which are supposed to be as short as possible. If, for example, a transmitting device is switched over from transmitting action to receiving action, prior to the evaluation of arriving data signals first the control time constant must expire, after which time an evaluatable data level is available. If, additionally in the sense of a transmission speed which is as high as possible at a specified band width, combined modulation types, for example, a phase amplitude modulation, are applied, in order to hold the signal-interference relationship as high as possible, the disadvantages of such a function become particularly visible.

Therefore, the purpose of the invention consists in improving a circuit arrangement of the above-mentioned type so that times which are as short as possible for the creation of an evaluatable data level at switching-over operations between various types of operation are available. For this, a control circuit is produced which meets, on one side during signal transmission, all existing control requirements and, on the other side during a transmission interruption and the arrival of new data signals, delivers practically immediately an evaluatable signal level.

A first attainment of the foregoing purpose consists inventively in a switch controllable depending from the level of the arriving data signals being arranged in front of a buffer store in the connection between an integral control and a correcting element, and in the output signals of the buffer store and the output signals of a control controlling a difference amplifier, which delivers a control signal holding the control at a predetermined control condition.

With this circuit arrangement it is easily possible, to meet the aforediscussed requirements. If the switch is closed in the connection between the integral control and the correcting element at the presence of a sufficient signal level, then a normal control loop is realized, within which the integral control delivers a control signal to the correcting element, so that same within specified limits holds constant the level of the received data signals. If, however, the data signal level drops below a predetermined value, for which a switching threshold can be determined, the switch is opened and the buffer store arranged after the switch delivers the earlier existing value of the control signal for the time of the data interruption to the correcting element. The correcting element maintains the amplification on the data signal transmitting path at the earlier existing value, so that at newly arriving data signals, which at semi-duplex operation according to definition have the earlier existing level, the specified amplification exists immediately again. However, one must consider hereby that when a further switching measure is missing, the integral control would change, namely "run-up" its output signal during the interruption of the data signals because of the missing of a normal magnitude signal, so that when the switch is anew closed, a changing of the adjusting value would occur. For this purpose according to a further characteristic of the invention, a difference amplifier is provided, which is controlled on one side through the output signals of the buffer store, thus through the control signal delivered to the correcting element and on the other side through the output signals of the control. If between these two control signals a difference occurs, which is the case when the integral control runs-up, an output signal can be taken from the difference amplifier, which is utilized at the input of the integral control for the compensation of such a signal change.

A circuit arrangement according to the invention meets all requirements of the semi-duplex operation. The circuit assures quick switching-over times by storing the control signal and the control signal can be removed by the deriving of a signal, characterizing the signal level in the data signal transmitting devices, for the level reporting of the conventional type. Further, it can control a switch device which, through the on and off switching of the receiving channel in the respective device, exactly define on-off conditions so that misevaluations due to spurious signals are avoided.

A second attainment of the above-mentioned purpose lies for a circuit arrangement of the above-mentioned type in a switch which can be controlled depending on the level of the arriving data signals arranged in front of the integral control, and in the integral control including a field effect operational amplifier having a capacity storing the normal magnitude signal and being held at a fixed reference voltage at the input. An additional advantage of this attainment is that in particular individual operations and balancing operations are not needed during the manufacture. A buffer store and a difference amplifier is not needed because a direct control of the correcting element by the integral control is possible. A line-dependent adjustment is not required.

BRIEF DESCRIPTION OF THE DRAWINGS

Exemplary embodiments of the invention will be described hereinafter in connection with the figures, which show.

DETAILED DESCRIPTION

Figure 1:
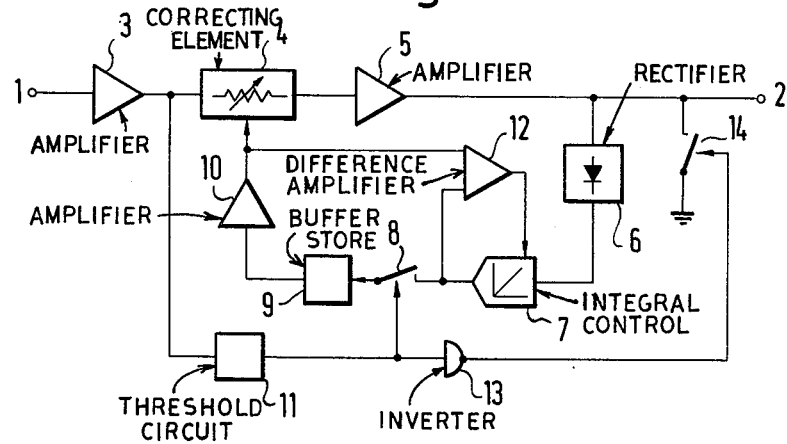
FIG. 1 is a block circuit diagram of the basic principle of the invention.

The principle of the invention is illustrated in FIG. 1 in form of a block diagram, which illustrates an amplification control device located in a data transmitting path having an input terminal 1 and an output terminal 2. This arrangement is, in one exemplary embodiment, connected to a data transmitting device. The data signals received at the input terminal 1 are thereby amplified between the input 1 and the output 2 and their magnitude controlled. An input amplifier 3 amplifies the data signals arriving at the input 1 and delivers the amplified signals to a correcting element 4 having a variable attenuation characteristic so that independent from the variation of said attenuation, the magnitude of the data signals is maintained substantially constant. A further amplifier 5 is series connected to the correcting element 4 and delivers at its output, or at the output terminal 2, an output voltage representative of the received data signals, which output voltage is available for use for a respective purpose.

A control loop is provided for adjusting the correcting element 4. The control loop is connected at one end to the data transmitting path between the amplifier 3 and the correcting element 4 and at the other end to the output 2. The control loop comprises a series connected rectifier 6, an integral control 7, a switch 8, a buffer store 9 and an amplifier 10. The control loop receives signals produced by the amplifier 5 and these signals are rectified by the rectifier 6 so that a control voltage is delivered to the integral control 7. The magnitude of these signals is a function of the magnitude of the data signals after amplification by the amplifier 5. If the switch 8 is closed, then the integral control 7 delivers at its output a control signal, which effects the adjustment of the correcting element 4. The control signal is, however, first sent through the buffer store 9 and the amplifier 10 so that after amplification, the control signal has a magnitude adjusted to the operation parameter of the correcting element 4.

The integral control 7 has a controllable time constant, with which the respective control action runs off. If this controllable time constant would not exist, a control signal would be delivered to the correcting element 4 which would occur simultaneously with all data signal magnitude changes, thus with the information changes resulting from the individual data signals. This is not desired for a magnitude control and, as a result, a control time constant must exist. Same, however, is proven to be disadvantageous when the arrangement illustrated in FIG. 1 does not receive data signals, for example, due to a switching over of associated devices from a receiving operation to a transmitting operation for a specified time and only thereafter is again switched over to the receiving operation and again data signals are received at the signal input 1. With the first data signal, the integral control receives again a normal magnitude signal required for its operation so that it delivers a control signal to the correcting element 4. However, the control signal is delayed corresponding to the control time constant of the integral control 7. This means, that only after this time constant is over the condition of a controlled signal level is achieved.

To avoid this disadvantage, an arrangement is provided for evaluating the magnitude of the data signal and for producing an alarm signal responsive to the magnitude of the signal at the output of amplifier 3 to the data transmitting path. This arrangement comprises a threshold circuit 11 connected to the output to the amplifier 3 so that the magnitude of the received data signals are evaluated to determine whether they exceed or fall below a specified threshold value. This threshold value can be adjusted so that the threshold circuit 11 delivers an output signal when data signals are received. The switch 8 can be closed by said signal. If now, due to a receiving interruption, the data signals are missing, the output signal of the threshold circuit 11 disappears so that the switch 8 is opened. The buffer store 9 has, however, stored the earlier produced control signal and feeds same through the amplifier 10 to the correcting element 4. Thus the earlier existing amplification adjustment remains in existence on the correcting element 4. If, after switching over to the receiving operation, data signals again arrive at the input 1, the magnitude of which corresponds, according to the condition of the semi-duplex operation, with the level of earlier received data signals, the control loop will not effect an adjustment of the correcting element 4 because the correcting element is already set at the proper value so that with the arrival of the first data signal, the evaluation of the specified signal voltage at the signal output terminal 2 is possible.

During a time that no signals appear at the input terminal 1, the integral control 7 will not receive any input. It would thus run-up when the input thereto is missing. The output signal from the integral control 7 would change with respect to the earlier existing switching condition, which, however, due to the opening of the switch 8, could have a disadvantageous effect on the correcting element 4 only when the switch 8, during arrival of new data signals, is again closed. In order to prevent the occurrence of this disadvantageous effect, a difference amplifier 12 is provided. The two control inputs of the difference amplifier are controlled by a signal corresponding to the normal magnitude signal and by the output signal of the integral control 7. For this, the two inputs are connected with the output of the integral control 7 and with the output of the amplifier 10. If, during the opened condition of the switch 8, a difference occurs between the two input variables to the difference amplifier 12, which is caused by the running-up of the integral control 7, then the difference amplifier 12 delivers a control signal to a control terminal for the integral control 7, through which this running-up can be compensated.

The signal of the threshold circuit 11 in addition controls through an inverter 13, a switch 14, so that the output 2 or the receiving channel can be placed at a zero potential when the signal of the threshold circuit 11 disappears. This effects the placement of a predefined output condition on the receiving channel so that erroneous evaluations caused by spurious signals and static are prevented. If again a signal appears at the threshold circuit, the switch 14 is opened.

Figure 2:
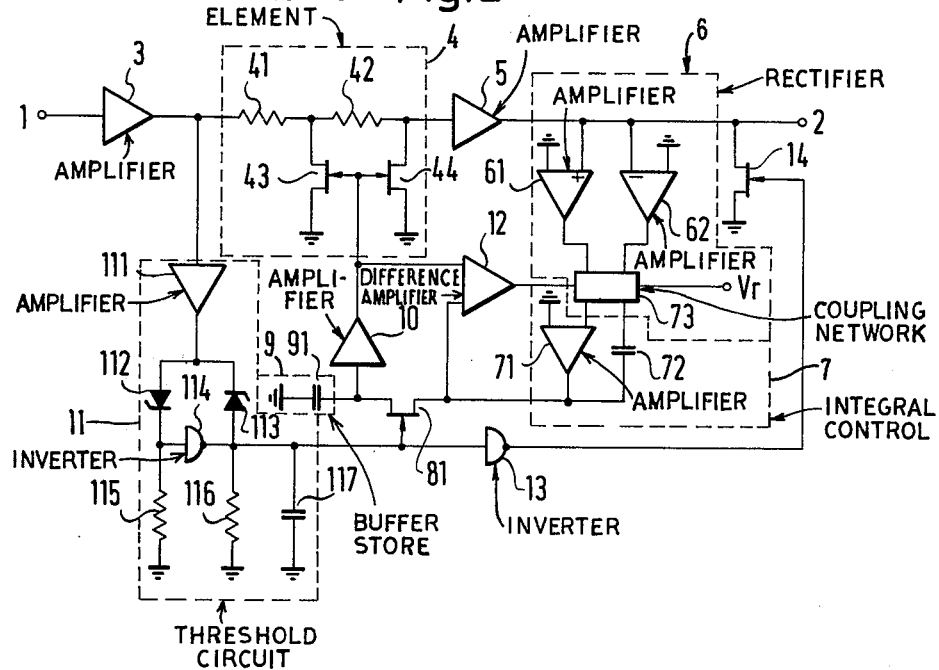
FIG. 2 is a more detailed circuit diagram showing the individual components of the basic principle circuit illustrated in FIG. 1.

FIG. 2 illustrates a circuit arrangement according to the invention in further detail. Similar components are identified by the same reference numerals used in FIG. 1. It must be recognized, however, that the control element 4 is comprised substantially of two ohmic resistors 41 and 42 and two field effect transistors 43 and 44, the control electrodes of which are connected together and to the output of the amplifier 10. With this double arrangement of two resistors and two field effect transistors, a very large range of regulation can be swept. Field effect transistors have, as is known, the behavior of almost ohmic resistors and permit a practically delay-free adjustment. Within the large range of regulation, the respective linear part of the transistor characteristic line is utilized also by the double arrangement. The circuit can, for example, operate in such a manner that at a low signal level the two field effect transistors 43 and 44 are blocked and that each increase in magnitude results in a change of the control signal in positive direction so that the two field effect transistors 43 and 44 are controlled conductingly. This operation continues until the input to the amplifier 5 is again at the prescribed value to produce the specified output voltage at the signal output terminal 2.

The signal output terminal 2 is connected to one input terminal of each of two operational amplifiers 61 and 62, whereby through the suitable wiring of the inverted or of the not inverted input the effect of a full-wave rectification without the existence of diode threshold voltages is achieved with these two amplifiers 61 and 62. The amplifiers 61 and 62 deliver the actual normal magnitude signal which is fed to the integral control 7 illustrated in FIG. 1 through a coupling network 73. As can be seen from FIG. 2, the integral control consists of an operational amplifier 71 which, together with a capacitor 72 forms an integrator. An input of the operational amplifier 71 is supplied with the normal magnitude signal, thus with the output signal of the two amplifiers 61 and 62, wherein, in addition, at this input a reference voltage Vr is connected through the coupling network 73. A variation of the output voltage of the two amplifiers 61 and 62 from the reference voltage Vr effects a control operation or the occurrence of a control signal at the output of the amplifier 71. The control signal is fed through a MOS-field effect transistor 81 to a capacitor 91, which corresponds to the buffer store 9 illustrated in FIG. 1. The MOS-field effect transistor 81 forms the switch 8 illustrated in FIG. 1. It has an insulated control electrode and thus does not contain, seen from the outside, a diode path in any possible current direction. The already described amplifier 10 is connected after the capacitor 91, which amplifier 10 is advantageously a high-ohmic field effect transistor amplifier. The output signal of the amplifier 10 is fed to the two control electrodes of the field effect transistors 43 and 44. If the capacity of the capacitor 91 was, for example, 1000 pF, a time constant of 5 sec. could be produced.

The MOS-field effector transistor 81 is controlled at its control electrode by a signal which is taken from the threshold circuit 11 illustrated in FIG. 1. The threshold circuit consists, as illustrated in FIG. 2, of an amplifier 111 which receives the output data signal from the amplifier 3 and brings it for the desired purpose to a suitable value. The output of the amplifier 111 is connected to a diode and resistance network, the switching threshold of which is realized through Zener diodes 112 and 113. These are switched oppositely with respect to one another and produce a voltage drop across two resistors 115 and 116, as soon as their threshold voltage is exceeded. The end of both resistors are connected through an inverter 114 so that a d.c. voltage is created at the resistor 116, when the threshold voltage of the two Zener diodes 112 and 113 is exceeded for positive and negative signal parts. The capacitor 117 which is connected in parallel with the resistor 116 effects a smoothing of this voltage with a time constant, which is substantially smaller than the control time constant of the integral control 7 (FIG. 1).

The threshold voltage of the two Zener diodes 112 and 113 is of a predetermined characteristic such that if the data signal falls below a safe criteria no data signal will be received. A d.c. voltage occurring at the capacitor 117 thus offers a criteria that data signals are received or that the entire arrangement is in a receiving condition. Thus, this d.c. voltage conductively controls the MOS-field effect transistor 81 so that the already described control action can take place. However, if the threshold voltage of the two Zener diodes 112 and 113 is not exceeded, then the MOS-field effect transistor 81 is blocked and the capacitor 91 delivers the afore-stored control signal to the amplifier 10. Furthermore, the switch 14, here a field effect transistor, is controlled by this control signal through the inverter 13. The switch 14 opens when a sufficient signal level exists; it closes when the receiving level falls below the threshold. Through this clear on-off conditions are assured and which are required for a perfect functioning of a semi-duplex operation.

The already described difference amplifier 12 always delivers during this time an output signal when the output signal of the operational amplifier differs from the control signal occurring at the output of the amplifier 10. Since the output signal of the difference amplifier 12 is fed through the coupling network 73 to the control input of the operational amplifier 71, it is able to influence the control input at a suitable polarity in such a manner that the running-up of the integrator consisting of the operational amplifier 71 and the capacitor 72 is compensated. Thus it is assured that during a renewed conduction of the field effect transistor 81, the control signal at the output of the amplifier 10 remains unchanged so that during a switching over from a transmitting to a receiving function the specified data signal voltage is available directly and without delay at the signal output terminal 2.

Figure 3:
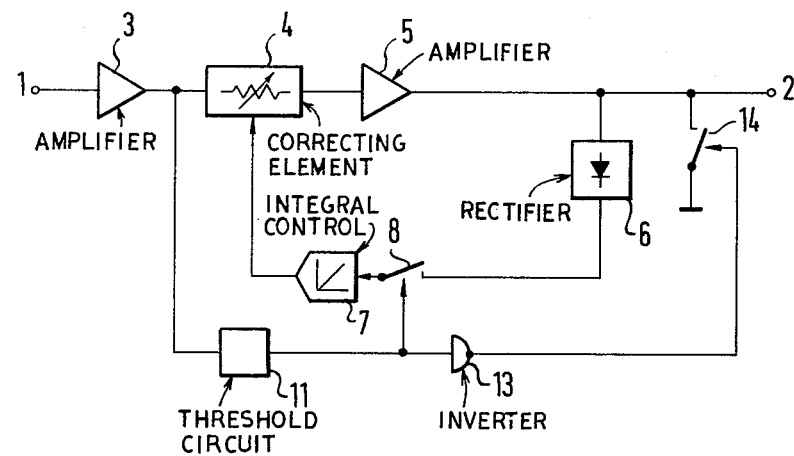
FIG. 3 is a block circuit diagram of a second embodiment of a circuit embodying the basic principle of the invention.

FIG. 3 illustrates a block circuit diagram of a second embodiment of the basic principle of the invention. This arrangement corresponds substantially with the arrangement illustrated in FIG. 1, however, the control loop is simpler in its construction. The reference numerals also used in FIG. 1 are used for the same parts.

In the arrangement illustrated in FIG. 3, as in the circuit of FIG. 1, the control loop receives the signal voltage produced by the amplifier 5. These signals are rectified by the rectifier 6, so that same delivers a control voltage through the switch 8 to the integral control 7 arranged in series after the switch. The level of the control voltage is a function of the level of the data signals from the output of the amplifier 5. If the switch 8 is closed, the integral control 7 produces a control signal at its output, which control signal effects an adjustment of the correcting element 4. The integral control 7 is equipped with storage characteristics and operates when the switch is closed in the storing mode having very large input resistance, because it contains a field effect operational amplifier and a capacitor storing the control voltage. When the path for the control voltage is interrupted by an opening of the switch 8, the capacitor of the integral control 7 will have stored the last control voltage value existing prior to the opening of the switch 8. Thus, when the switch 8 is opened, the last control voltage value existing prior to the switch opening is maintained at the output of the integral control 7.

In the arrangement illustrated in FIG. 3, a threshold circuit 11 is connected to the data transmitting path at the output from the amplifier 3. A level reporting signal is produced by the threshold circuit. The threshold value of the threshold circuit 11 can be adjusted so that the threshold circuit 11 delivers an output signal only when data signals are received. The switch 8 is closed by this signal. If due to an interruption in the receiving of the data signals, the output signal of the threshold circuit 11 will disappear and the switch 8 will be opened. The integral control 7 which previously operated as a storage device storing the earlier existing control voltage will now deliver the corresponding control signal to the correcting element 4. Thus, the amplification adjustment on the correcting element 4 existing prior to the opening of the switch 8 remains in existence. If after the switching over of the circuitry connected to the input 1 to the receiving operation, new data signals again are received, the level of which corresponds to the condition of the semi-duplex-operation. The control loop does not need to adjust with its time constant the amplification factor to the required value because the circuit is already adjusted to this value. Thus, with the arrival of the first data signal, the evaluation of the specified signal voltage at the signal output 2 is possible.

The control of the switch 14 through the inverter 13 is accomplished in the manner described already for the arrangement according to FIG. 1.

Figure 4:
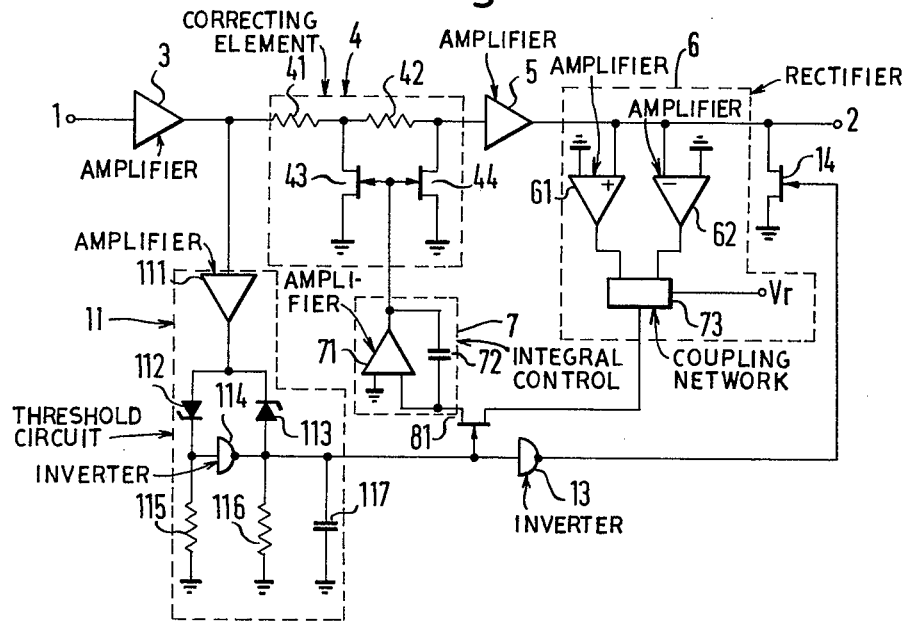
FIG. 4 is a more detailed circuit diagram showing the individual components of the basic principle circuit illustrated in FIG. 3.

FIG. 4 illustrates in further detail the arrangement according to FIG. 3. The amplifiers 61 and 62 which effect a rectification deliver a normal magnitude signal, which is fed through a coupling network 73 to the integral control 71. As can be taken from FIG. 4, the integral control consists of an operational amplifier 71, which forms with a capacitor 72 an integration circuit. The operational amplifier 71 is a field effect operational amplifier so that it has a very high input impedance and upon an opening of the switch 8 (FIG. 3) operates as a storage supply device. The input of the operation amplifier 71 is fed with the normal magnitude signal, thus with the output signal of both amplifiers 61 and 62, through a switch 81, which is a MOS-field effect transistor. Further, a reference voltage $V_r$ is connected to the input of the operational amplifier 71 through the coupling network 73. A variation of the output voltage of the two amplifiers 61 and 62 from the reference voltage $V_r$ effects, like in the circuit illustrated in FIG. 2, a control action or rather the occurrence of a control signal at the output of the amplifier 71. The control signal is fed onto the correcting element 4 (FIG. 3) or onto the control electrodes of the two field effect transistors 43 and 44 (FIG. 4). The MOS-field effect transistor 81 forming the switch 8 has an insulated control electrode and thus has the already described characteristics of the corresponding transistor of the circuit illustrated in FIG. 2. The threshold circuit according to FIG. 4 corresponds to the one according to FIG. 2, so that it needs no further discussion. The same is true for the control for the field effect transistor 14 through the inverter 13.

Although particular preferred embodiments of the invention have been disclosed in detail for illustrative purposes, it will be recognized that variations or modifications of the disclosed apparatus, including the rearrangement of parts, lie within the scope of the present invention.

The embodiments of the invention in which an exclusive property or privilege is claimed are defined as follows:

1. In a circuit arrangement for controlling of amplification devices in the semi-duplex data signal transmission system, comprising an integral control which is controlled by a normal magnitude signal derived from the output of a respective amplification device in the data signal transmitting path, which integral control delivers a control signal for adjusting a correcting element in the data signal transmitting path to effect an adjustment of an amplification factor, the improvement comprising a buffer store having an input terminal and an output terminal, a switch controllable depending on the level of the arriving data signals series connected to the input terminal, the output terminal being connected to the correcting element and to a difference amplifier, tne output signals of the buffer store and the output signals of the integral control, control the difference amplifier, which delivers a control amplitude to the integral control to hold the integral control at a specified control condition.

2. The improved circuit arrangement according to claim 1, wherein the level-dependently controllable switch is controlled by a threshold circuit.

3. The improved circuit arrangement according to claim 1, wherein the level-dependently controllable switch is a MOS-field effect transistor.

4. The improved circuit arrangement according to claim 2, wherein the threshold circuit delivers a control signal for a switch device which switches on and off the data signal transmitting path following the correcting element.

5. The improved circuit arrangement according to claim 4, wherein the switch device is a field effect transistor and which connects the data signal transmitting path to a source of zero potential and the control electrode of which is connected through an inverter to the level-dependently controllable switch.

6. The improved circuit arrangement according to claim 1, wherein the buffer store is a capacitor, after which is connected a field-effect-operation amplifier.

7. The improved circuit arrangement according to claim 1, wherein the output of the field effect operational amplifier is connected with two control inputs of the correcting element, which inputs are formed by the control electrodes of two field effect transistors connected to the data signal transmitting path, whereby an ohmic resistor is connected in before the respective connecting point on the data signal transmitting path, which ohmic resistor is connected into the data signal transmitting path.

8. In a circuit arrangement for controlling of amplification devices in the semi-duplex data signal transmission system, comprising an integral control which is controlled by a normal magnitude signal derived from the output of a respective amplification device in the data signal transmitting path, which integral control delivers a control signal for adjusting a correcting element in the data signal transmitting path to effect an adjustment of an amplification factor, the improvement comprising an integral control having an input terminal and an output terminal, a first switch controllable dependent from the level of the arriving data signals series connected to the input terminal, the output terminal being connected to the correcting element, the integral control including an operational amplifier having a capacitance storing the normal magnitude signal and is maintained at a fixed reference voltage ($Vr$) at the input.

9. The improved circuit arrangement according to claim 8, wherein the level-dependently controllable switch is controlled by a threshold circuit.

10. The improved circuit arrangement according to claim 8, wherein the level-dependently controllable switch is a MOS-field effect transistor.

11. The improved circuit arrangement according to claim 9, wherein the threshold circuit delivers a control signal for a second switch device which switches on and off the data signal transmitting path following the correcting element.

12. The improved circuit arrangement according to claim 11, wherein the second switch device is a field effect transistor and which connects the data signal transmitting path to a source of zero potential and the control electrode of which is connected through an inverter to the level-dependently controllable switch.

13. The improved circuit arrangement according to claim 8, wherein the output of the operational amplifier is connected to a control electrode of each of two field effect transistors, at least one of the output terminals of said two field effect transistors being connected to the data signal transmitting path, whereby an ohmic resistor is connected in before the respective connecting point on the data signal transmitting path, which ohmic resistor is connected into the data signal transmitting path.

* * * * *